United States Patent [19]

Gupta

[11] Patent Number: 5,427,621

[45] Date of Patent: Jun. 27, 1995

[54] METHOD FOR REMOVING PARTICULATE CONTAMINANTS BY MAGNETIC FIELD SPIKING

[75] Inventor: Anand Gupta, San Jose, Calif.

[73] Assignee: Applied Materials, Inc., Santa Clara, Calif.

[21] Appl. No.: 145,920

[22] Filed: Oct. 29, 1993

[51] Int. Cl.⁶ .................................................. B08B 6/00
[52] U.S. Cl. ........................................... 134/1; 134/2; 437/946; 216/67
[58] Field of Search ........................ 134/1, 2; 437/946; 156/643

[56] References Cited

U.S. PATENT DOCUMENTS 4,874,494 10/1989 Ohmi .............................. 204/192.12
5,114,529 5/1992 Masuyama ............................. 134/1

FOREIGN PATENT DOCUMENTS 2-257625 10/1990 Japan .

Primary Examiner—George Wyszomierski
Assistant Examiner—Sean Vincent
Attorney, Agent, or Firm—Randy W. Tung; Peter J. Sgarbossa

[57] ABSTRACT

A novel and improved method of in-situ cleaning unwanted films and particles of a material from a surface situated inside a vacuum chamber by equipping such chamber with a means of generating a magnetic field having a magnetic flux density of at least 25 gauss, flowing at least one gas into the chamber and igniting a plasma and thus producing plasma ions of at least one gas, switching on the magnetic field generating means to a magnetic flux density of no less than 25 gauss and, reducing the magnetic field by a flux density of at least 10 gauss such that the unwanted films and particles of the material are dislodged from the surface by the sudden change in the magnetic flux density at the magnetic field.

17 Claims, 1 Drawing Sheet

METHOD FOR REMOVING PARTICULATE CONTAMINANTS BY MAGNETIC FIELD SPIKING

FIELD OF THE INVENTION

The present invention generally relates to a novel method of cleaning unwanted films and particles from a surface situated inside a vacuum chamber and more particularly, relates to a novel method of in-situ cleaning unwanted films and particles of a contaminant material from a surface situated inside a vacuum chamber which is equipped with plasma enhancement and a magnetic field generating means such that unwanted films and particles can be dislodged from the surface by a magnetic field spiking technique.

BACKGROUND OF THE INVENTION

In the fabrication of semiconductor devices, various structures such as metallization layers, passivation layers, insulation layers, etc. are formed on a substrate. The quality of the semiconductor device fabricated is a strong function of the processes with which these structures are formed. The quality is also a function of the cleanliness of the manufacturing environment in which the substrate is processed.

Technological advances in recent years in the increasing miniaturization of semiconductor circuits necessitate more stringent control of impurities and contaminants in the processing chamber of the semiconductor device. When the miniaturization of the device progresses to the submicron level, the minutest amount of contaminants can significantly reduce the yield of wafers. For instance, the presence of particles during deposition or etching of thin films can cause voids, dislocations or short-circuits which adversely affect performance and reliability of the devices.

Particle and film contamination has been significantly reduced by improving the quality of clean rooms and by automated equipment designed to handle semiconductor substrates, and also by improving techniques used to clean the substrate surfaces. However, many particles are generated and film contaminated inside substrate processing chambers themselves. Possible sources of contamination include processing materials, interior walls of processing chambers, and the mechanical wear of the automated substrate handling equipment.

In processing equipment that uses plasma enhancement, many chemically reacted fragments of various kinds are generated from the processing gases which include ions, electrons and radicals. The fragments can combine to form slightly negatively charged particles which may ultimately contaminate a substrate being processed. Additionally, various materials such as polymers are coated onto the process chamber walls during plasma processing. Mechanical and thermal stresses may cause these materials to fracture and dislodge from the walls and generate additional contaminant particles. Other possible sources of contaminants are oil from vacuum pumps, and particles generated within the processing chambers during substrate transfer operations.

The techniques of in-situ cleaning of process chambers have been developed in recent years. Various kinds of cleaning gases such as nitrogen trifluoride, chlorine trifluoride, hexafluoroethane, sulfur hexafluoride and carbon tetrafluoride and mixtures thereof have been used in various cleaning applications. These gases are flowed into a process chamber at a predetermined temperature and pressure for a desirable length of time to clean the surfaces inside a process chamber. However, these cleaning techniques are not always effective in cleaning or dislodging all the film and particle contaminants coated on the chamber walls. The minutest amount of contaminants left over from such cleaning process can cause significant problems in the subsequent manufacturing cycles.

It is therefore an object of the present invention to provide an improved in-situ cleaning method for surfaces inside a process chamber that does not have the shortcoming of the prior art cleaning methods.

It is another object of the present invention to provide a novel in-situ cleaning method for surfaces inside a process chamber that can be carried out without a significant process change or equipment modification.

It is a further object of the present invention to provide a novel in-situ cleaning method for surfaces in a process chamber of film and particle contaminants by using a magnetic field spiking technique.

It is yet another object of the present invention to provide an improved in-situ cleaning method for surfaces inside a process chamber equipped with plasma enhancement by providing a magnetic field inside the chamber and means to switch on and off such magnetic field.

SUMMARY OF THE INVENTION

In accordance with the present invention, a novel method for in-situ cleaning of film or particle contaminants from surfaces inside a process chamber equipped with both plasma enhancement and magnetic field enhancement by using a magnetic field spiking technique is provided.

In the preferred embodiment, the novel in-situ cleaning method is provided by equipping a process chamber with rotating magnets capable of generating a magnetic field inside the process chamber of a sufficient magnetic flux density. At least one gas of either inert or cleaning nature is then flown into the chamber. Radio frequency power is then applied to a cathode and an anode inside the process chamber to ignite a plasma of the gas particles. A magnetic field is then switched on to trap and gyrate/orbit the electrons released in the plasma cloud within the magnetic field. The magnetic field confines the electrons and traps them in the plasma such that more collision occurs with atoms or molecules of the gas to produce more electrons. The magnetic flux density in the magnetic field generated should be at least 25 gauss. After a period of time, i.e., longer than one second, the magnetic field is either ramped down or switched off to reduce the magnetic flux density by at least 10 gauss. As a consequence, the electrons suddenly released by the magnetic field and their associated ions bombard the inside surfaces of the process chamber to dislodge any film or particulate contaminants coated on the chamber walls. The film or particulate contaminants are then carried away by the gas flowing out of the process chamber.

BRIEF DESCRIPTION OF THE DRAWINGS

Other objects, features and advantages of the present invention will become apparent upon consideration of the specification and the appended drawings, in which.

DETAILED DESCRIPTION OF PREFERRED EMBODIMENTS

The present invention provides a novel and improved method on in-situ cleaning of film and particulate contaminants from surfaces inside a plasma process chamber by equipping the chamber with a magnetic field generating device such that a magnetic field spiking technique can be used.

Figure 1:
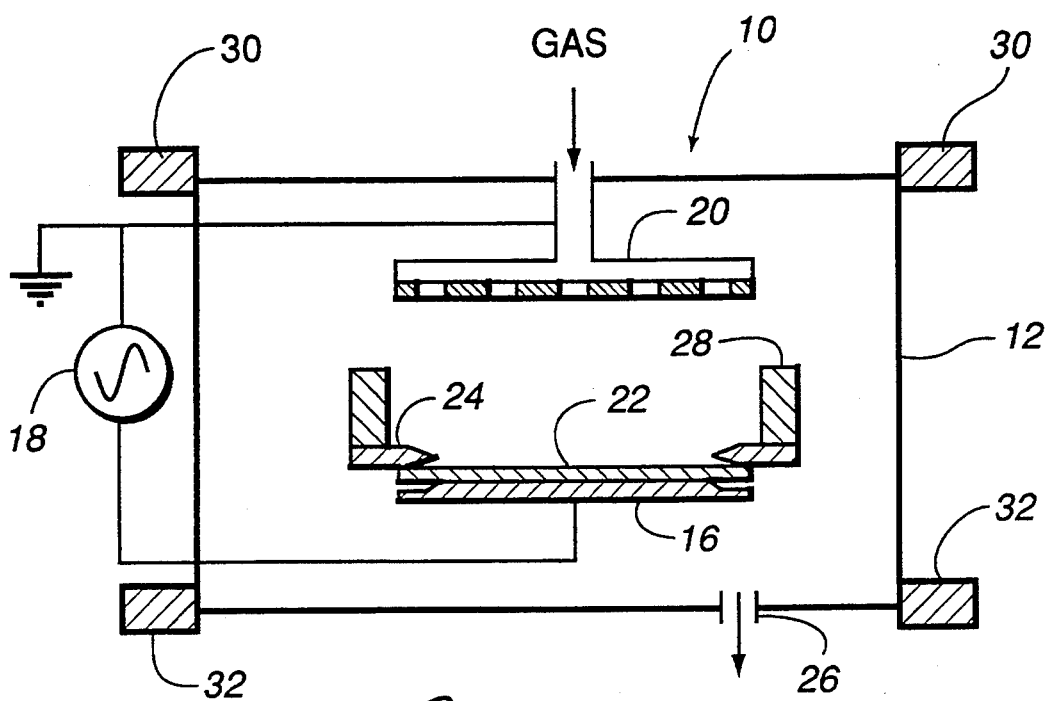
FIG. 1 is a schematic view of a plasma processing chamber equipped with magnetic field enhancement.

Referring initially to FIG. 1, where a schematic view, partly in section, of a plasma processing chamber equipped with magnetic field enhancement is shown. FIG. 1 depicts a plasma etch reactor 10 including a housing, typically made of a non-magnetic material such as aluminum, which defines a plasma processing chamber 12. A substrate support 16 which is also a cathode is connected to a radio-frequency generator 18 which is in turn connected to a gas inlet shower head or the anode 20. Processing gases are supplied to chamber 12 through the gas inlet shower head (or manifold plate) 20. A semiconductor substrate 22 to be processed is positioned on the substrate support or cathode 16. The substrate 22 is held against cathode 16 by means of a clamping ring 24. During plasma processing, substrate 22 heats up and must be cooled by a cooling gas which is supplied by unillustrated means and which transfer heat to the water cooled support 16. The clamping ring 24 is therefore required to hold the substrate down against the pressure developed by the cooling gas. An exhaust port 26 connected to a vacuum pump (not shown) evacuates the chamber. An upper rotating magnet 30 and a lower rotating magnet 32 functions together to provide a magnetic field inside the process chamber 12. Other magnetic field generating means such as stationary coils may also be used.

In a typical cleaning process after an etching or deposition cycle, a cleaning gas supply is fed through the gas inlet port 20 into the chamber and the RF generator 18 is turned on. A plasma of the gas ions forms in a space between the gas shower head 20 and the substrate 22 while cooling gas is supplied to the underside of the substrate 22.

Figure 2:
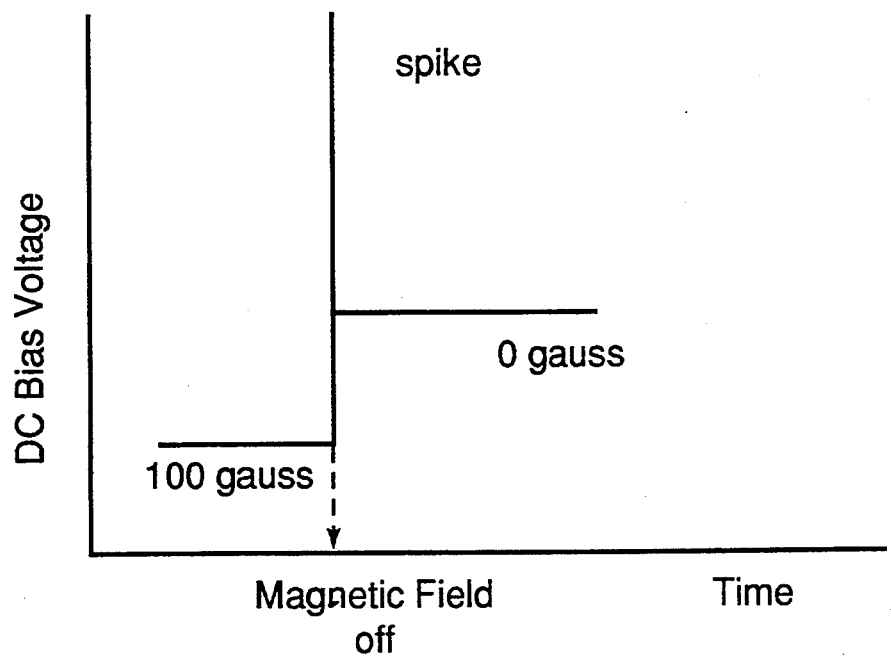
FIG. 2 is a graph showing the magnetic field spiking phenomenon.

The present invention that utilizes a unique magnetic field spiking technique to clean film or particulate contaminants from a chamber surface can be explained as follows. Film deposits or particles that are adhered to the chamber surfaces can be loosened and pulled away by using a sudden change in the magnetic field. This sudden change in the magnetic field is known as a magnetic field spiking phenomenon as shown in FIG. 2. A plot of DC bias voltage applied to the coils 30 and 32 against time for a magnetic field enhancement is shown in FIG. 2. A voltage spike is shown at the moment when the magnetic field is switched off from 100 gauss to 0 gauss. After the film deposits or particles are dislodged from the chamber surface, these materials or particles are pumped out of the process chamber by a vacuum pump. The rate at which the magnetic field is ramped down or turned off influences the material dislodging from the surface in the form of particles. The higher the delta (the differential) of magnetic field, the more material in the form of particles or flakes are dislodged.

The present novel cleaning method can be utilized in two ways. First, during the etch process the magnetic field should be changed slowly or coupled with RF power such that large flux of electrons do not bombard the chamber surface. On the other hand, when chamber cleaning is conducted, a maximum delta in magnetic field should be created to dislodge as much material as possible such that the contaminant material can be pumped out of the chamber.

The present novel and improved in-situ cleaning process by utilizing magnetic field spiking can be used in any plasma process chamber which is equipped with magnetic enhancement or can be applied to those process chambers where magnets can be attached in a deposition, etch, or in-situ cleaning process used in a chemical vapor deposition, etch, and physical vapor deposition system.

Tests were conducted in an etch chamber to demonstrate the effect of magnetic field spiking. A typical etch chamber used is a Precision 5000 Etch TM which is supplied by the Applied Materials Corporation in Santa Clara, Calif. In these tests, magnetic flux density was changed from 25 gauss to 15 gauss, from 50 gauss to 10 gauss, and from 100 gauss to 0 gauss, respectively, by either switching off the magnetic field or by ramping down the magnetic field strength. In each instance, the high magnetic flux density was switched on (or kept on) for a period of 1 second, more preferably for 2–3 seconds, and most preferably for 4–6 seconds. Test data indicates that a minimum switched-on time of 1 second is sufficient to dislodge silicon dioxide films and particles from the chamber walls. It was observed that the rate at which the magnetic flux density is changed, i.e. $dB/dt$, where B is the magnetic flux density and t is the time, is also important. The rate $dB/dt$ generally should be such that the switch-off time is smaller than the life of the bombarding ions. The temperature and pressure of the process chamber used during such cleaning process is the same as that used in a normal cleaning process, i.e., in a temperature range between 25°–400° C. and in a pressure range between 10–1000 m Torr. The present novel method of cleaning has been demonstrated on various films and particles such as silicon dioxide, aluminum nitride, silicon nitride and various polymers that are normally formed inside a process chamber.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, any inert or cleaning gas can be used in the process chamber. While a process chamber for etching is demonstrated, other process chambers for physical vapor deposition or chemical vapor deposition can also be used.

The embodiments of the invention in which an exclusive property or privilege is claimed are defined as follows:

1. A method of cleaning unwanted films and particles of a material from a surface situated inside a vacuum chamber comprising the steps of:
   flowing at least one gas into said chamber,
   igniting a plasma and generating plasma ions of said at least one gas,
   generating a magnetic field such that a magnetic flux density of at least 25 gauss is produced, and
   reducing said magnetic field by a flux density of at least 10 gauss such that said unwanted films and particles of said material are removed from said surface by the sudden change in the magnetic flux density of the magnetic field.

2. A method according to claim 1, wherein said gas is an inert gas or cleaning gas.

3. A method according to claim 1, wherein said gas is at least one cleaning gas selected from the group consisting of $NF_3$, $ClF_3$, $C_2F_6$, $SF_6$, and $CF_4$.

4. A method according to claim 1, wherein said magnetic flux density of at least 25 gauss is switched on for a time period of at lest one second.

5. A method according to claim 1, wherein said magnetic flux density of at least 25 gauss is switched on for a time periods between 2–3 seconds.

6. A method according to claim 1 wherein said magnetic flux density of at least 25 gauss is switched on for a time period between 4–6 seconds.

7. A method according to claim 1, wherein said vacuum chamber is a physical vapor deposition chamber, an etcher, or a chemical vapor deposition chamber.

8. A method according to claim 1, wherein said contaminants removed from said chamber are particles of silicon dioxide.

9. A method according to claim 1, wherein said contaminants removed from said chamber are particles of a polymer.

10. A method according to claim 1, wherein said magnetic field generating means is a pair of rotating magnets.

11. A method of removing contaminants from surfaces inside a vacuum chamber for plasma processes, comprising the steps of:

flowing at least one gas into said chamber, igniting a plasma to ionize the gas within said chamber and produce ions, establishing a magnetic flux density within said chamber, substantially reducing said first flux density within a time period smaller than the lifetime of the ions of said gas, such that the change in said flux density dislodges contaminants from surfaces inside said chamber.

12. A method of removing contaminants from surfaces inside a vacuum chamber for plasma processes according to claim 11, wherein said magnetic flux density established is at least 25 gauss.

13. A method of removing contaminants from surfaces inside a vacuum chamber for plasma processes according to claim 11, wherein said magnetic flux density is established for a time period of at least 1 second.

14. A method of removing contaminants from surfaces inside a vacuum chamber for plasma processes according to claim 11, wherein said magnetic flux density is reduced to 0 within a time period smaller than the lifetime of the ions of said gas.

15. A method of removing contaminants from surfaces inside a vacuum chamber for plasma processes according to claim 11, wherein a magnetic flux density of 25 gauss is established for at least 1 second and then reduced to 15 gauss.

16. A method of removing contaminants from surfaces inside a vacuum chamber for plasma processes according to claim 11, wherein a magnetic flux density of 50 gauss is established for at least 1 second and then reduced to 0 gauss.

17. A method of removing contaminants from surfaces inside a vacuum chamber for plasma processes according to claim 11, wherein a magnetic flux density of 100 gauss is established for at least 1 second and then reduced to 0 gauss.

* * * * *